(12) United States Patent
Ahmadi

(10) Patent No.: US 7,649,395 B2
(45) Date of Patent: Jan. 19, 2010

(54) SCAN FLIP-FLOP WITH INTERNAL LATENCY FOR SCAN INPUT

(75) Inventor: Rubil Ahmadi, Thornhill (CA)

(73) Assignee: ATI Technologies ULC, Markham, Ontario (CA)

( * ) Notice: Subject to any disclaimer, the term of this patent is extended or adjusted under 35 U.S.C. 154(b) by 47 days.

(21) Appl. No.: 11/748,686

(22) Filed: May 15, 2007

(65) Prior Publication Data

US 2008/0284480 A1 Nov. 20, 2008

(51) Int. Cl.
*H03K 3/289* (2006.01)
*H03K 3/356* (2006.01)

(52) U.S. Cl. ............................ 327/202; 327/203
(58) Field of Classification Search .................. None
See application file for complete search history.

(56) References Cited

U.S. PATENT DOCUMENTS

| | | | |
|---|---|---|---|
| 5,576,644 A * | 11/1996 | Pelella | 327/51 |
| 5,870,340 A | 2/1999 | Ohsawa | |
| 5,886,901 A * | 3/1999 | Magoshi | 716/6 |
| 5,898,330 A * | 4/1999 | Klass | 327/210 |
| 6,023,778 A | 2/2000 | Li | |
| 6,389,566 B1 * | 5/2002 | Wagner et al. | 714/726 |
| 6,614,276 B2 * | 9/2003 | Robertson et al. | 327/211 |
| 6,895,540 B2 | 5/2005 | Chen et al. | |
| 7,401,278 B2 * | 7/2008 | Verwegen | 714/726 |
| 2004/0015759 A1 * | 1/2004 | Chen et al. | 714/726 |

FOREIGN PATENT DOCUMENTS

| | | |
|---|---|---|
| JP | 08005710 | 1/1996 |
| JP | 10153641 | 6/1998 |

OTHER PUBLICATIONS

Jaramillo, Ken and Subbu Meiyappan, "10 Tips for Successful Scan Design: Part One", Philips Semiconductors, Electronics Design, Strategy, News, Feb. 17, 2000, pp. 67-75.

(Continued)

*Primary Examiner*—Tuan Lam
(74) *Attorney, Agent, or Firm*—Vedder Price P.C.

(57) ABSTRACT

A scan flip-flop circuit including a data input, a scan input, a data output, a flip-flop, a multiplexer and a delay element is provided. The multiplexer allows selection of either the scan input or the data input for presentation at the input of the flip-flop. The flip-flop provides an output signal at the output of the scan flip-flop. The delay element is in a signal path between the scan input and the input of the flip-flop, and provides a signal propagation delay between the scan input and the input of the flip-flop. The delay between the scan input and the input of the flip-flop is substantially larger than the signal propagation delay between the data input and the input of the flip-flop. The delay in the scan path reduces the need for external buffers to avoid hold-time violations during scan testing of integrated circuits.

21 Claims, 12 Drawing Sheets

OTHER PUBLICATIONS

AN-640: "Understanding and Minimizing Ground Bounce", Fairchild Semiconductor Application Note, Jun. 1989, revised Feb. 2003.

Micro-SPARC-IIep: "Introduction to JTAG Boundary Scan", White Paper, Sun Microelectronics, Jan. 1997.

Brisacher, Kirk et al., "The History and Future of Scan Design", EE Times Online: Design News, CMP Media. Available: <http://www.eetimes.com/showArticle.jhtml?articleID=170701653>.

International Search Report for International Patent Application No. PCT/CA2008/000874: filed May 7, 2008, Form PCT/ISA/210, ISA/CA, Gatineau, Quebec.

* cited by examiner

| Circuit | $t_S$ at D (ps) | $t_H$ at D (ps) | $t_S$ at SI (ps) | $t_H$ at SI (ps) | Number of Transistors | Power | |
|---|---|---|---|---|---|---|---|
| | | | | | | D (μW) | SI (μW) |
| 102 (FIG.4) | 35 | -17.5 | 51 | -27 | 32 | 8.9 | 9.63 |
| 102+3 buffers (FIG.1) | 35 | -17.5 | | | 44 | 8.98 | 12.87 |
| 500 (FIG.6) | 35 | -17.5 | 135 | -51.5 | 34 | 8.9 | 15.36 |
| 700 (FIG.9) | 35 | -17.5 | 180 | -119 | 38 | 8.9 | 12.84 |

FIG. 13

SCAN FLIP-FLOP WITH INTERNAL LATENCY FOR SCAN INPUT

FIELD OF THE INVENTION

The present invention relates generally to digital circuits, and more particularly to scan flip-flops.

BACKGROUND OF THE INVENTION

Digital circuits play an increasingly important role in a variety of devices such as digital cameras, cellular telephones, digital music players and digital video disk (DVD) players, portable computing devices and digital television sets.

Further proliferation of digital devices will be aided by continued decreasing costs, as exemplified by the increasing density of transistors packed on to a given area of silicon die. Reducing the area consumed by an integrated circuit (IC) formed on a silicon die is thus an important factor in lowering costs. Moreover, smaller die sizes are desirable as they increase the yield from a given silicon wafer. Performance is also typically increased as electrical interconnections between various blocks in the integrated circuit are shortened.

Flip-flops are among the basic building blocks used in digital circuits. Flip-flops are used in sequential circuits to store state information. State transitions occur at predetermined times, typically defined by rising or falling edges of a clock signal.

A typical flip-flop has a data input, a clock input and a data output. Data at the data input is sampled, and provided at the output, at a rising or falling clock edge. Typically, to reliably sample the input signal a flip-flop requires the input signal level to be stable for a defined minimum duration before a clock edge (used for sampling the input data). This duration is called the setup-time. Similarly, flip-flops also require the sampled input signal to remain stable after the clock edge, for a defined duration. This duration is called the hold-time. If the input signal level is sampled before the setup-time, a setup-time violation occurs. Similarly, if the input signal changes before the required minimum duration following the clock edge used for sampling, a hold-time violation occurs.

If a circuit is to operate reliably, neither setup-time violations nor hold-time violations should occur. As can be appreciated, in high speed circuits utilizing a clock signal with high frequency, it is often challenging to ensure that no setup-time or hold-time violations occur. Hold violations often occur in pipeline stages of a circuit that have no combinatorial logic between them. Without combinational logic, the propagation delay of signals between stages is negligible.

A typical application where hold-time violations may be observed is in the testing of integrated circuit chips. One of the more popular methods for testing integrated circuits is the scan test. In scan tests, flip-flops in the circuit are connected together to effectively form a large shift register. A multiplexer at an input of a flip-flop is set to select either a scan test input during testing, or ordinary data input, during normal operation. A circuit block including a multiplexer and a flip-flop, with the multiplexer having a scan input, a normal data input, and an output interconnected to the input of a flip-flop, is called a scan flip-flop or scan cell.

During scan tests, the combinatorial blocks in a circuit may be bypassed as scan test data is shifted into pipeline stages made of scan flip-flops. Scan flip-flops so operated have no combinatorial logic connected between them, and signals propagate from one stage to another very quickly, potentially causing hold-time violations.

To counter hold-time violations, buffers are often inserted between scan flip-flops. Unfortunately, inserting buffers causes the area required by the resulting integrated circuit to increase, thereby increasing costs.

Accordingly, there is a need for a flip-flop that is better suited to achieve hold-time requirements on scan input and reduces the need for inserted buffers.

SUMMARY OF THE INVENTION

According to one aspect of the present invention, there is provided, a scan flip-flop circuit including a data input, a scan input, a data output, a flip-flop, a multiplexer and a delay element. The flip-flop provides an output signal at the data output of the scan flip-flop circuit. The multiplexer is used for selecting a signal at one of the scan input and the data input, for presentation at an input of the flip-flop. The delay element is in a signal path between the scan input and the input of the flip-flop, and provides a signal propagation delay between the scan input and the input of the flip-flop. The delay between the scan input and the input of the flip-flop is in excess of a signal propagation delay between the data input and the input of the flip-flop.

According to another aspect of the present invention, there is provided a method of operating a scan flip-flop circuit which includes a data signal input for receiving a data signal, a scan input for receiving a scan signal and a clock input for receiving a clock signal. The method includes receiving a scan signal at the scan input, and receiving a clock signal at the clock input. In addition, the method includes providing the data signal input and the scan signal input to a multiplexer; providing the clock signal to a flip-flop; and selecting the scan signal using the multiplexer for presentation at an input of the flip-flop. The method includes introducing a delay in the multiplexer along a signal path of the scan signal from the scan input to the flip flop, that is sufficient to allow sampling of the scan signal at the flip-flop on an edge of the clock signal, in the absence of any additional delays in the signal path of the scan signal; and providing an output of the flip-flop as an output signal of the circuit.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

FIG. 13 is a table of setup-time, hold-time, power consumption and transistor count, for example circuits.

DETAILED DESCRIPTION

Figure 1:
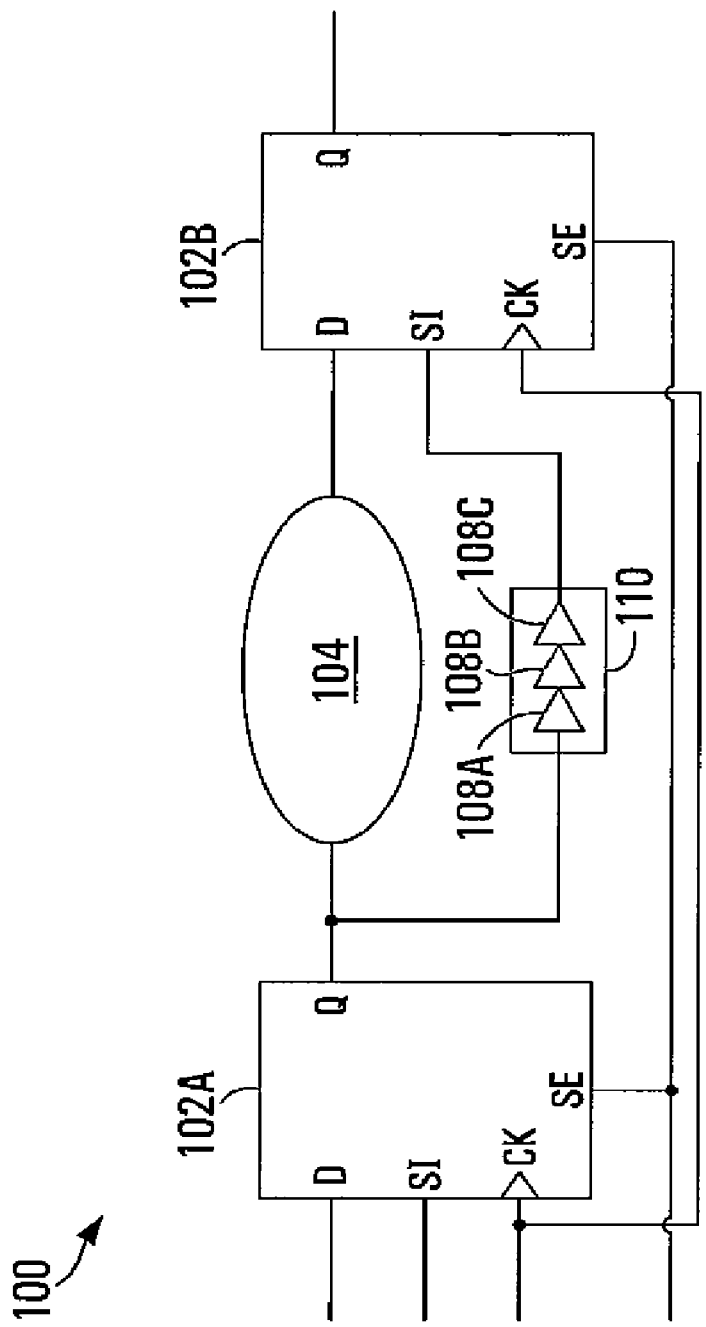
FIG. 1 is a partial schematic diagram of a circuit including scan flip-flops and combinatorial logic.

FIG. 1 depicts a simplified schematic diagram of an integrated circuit 100 with conventional scan flip-flops 102A, 102B (individually and collectively scan flip-flops 102), a combinatorial block 104, and buffers 108A, 108B, 108C (individually and collectively delay buffers 108). As depicted, each scan flip-flop 102A, 102B has a normal or functional data input (D), a scan input (SI), as well as clock input (CK). The output of scan flip-flop 102A may be interconnected to a combinatorial block 104 which further interconnects another scan flip-flop 102B. In case of a non-ideal clock distribution, there may be a skew between clock signals supplied to scan flip-flops 102A and 102B. As will become apparent, delay buffers 108 are inserted to introduce propagation delay in some signal paths, to help meet timing requirements.

Testing is important in the manufacturing of integrated circuits. While simulations are used to verify the design of a circuit such as circuit 100, manufactured chips must ultimately be physically tested to ensure that they are free of production defects. Some short-circuits or open-circuits may be formed erroneously in the production process. These faults typically lead to 'stuck-at-zero' or 'stuck-at-one' errors, in which certain outputs are unresponsive to different input signals. These can only be detected by post-production testing of the physical chip.

One common method of testing integrated circuit chips involves the use of test vectors. Test vectors are input test patterns to be applied to the input pins of the integrated circuit, and output patterns expected from the output pins. A tester, often called automatic test equipment (ATE), applies these test vector inputs to the input of the chip and compares the output to the expected response. However, the number of possible test inputs grows exponentially with the number of input pins available, and thus for larger circuits, such an approach does not provide adequate fault coverage without significant test time.

For complex designs, such as system-on-a-chip integrated circuits which may include one or more embedded processors, a digital signal processor (DSP) and an on-chip memory, testing with test-vectors while maintaining adequate coverage is often very laborious and time consuming. In addition, the existence of sequential circuit elements means that outputs are functions of not only the inputs, but also the state of flip-flops in the circuit as well. Accordingly, scan tests are often used to test IC chips particularly those with a significant gate count. Scan tests operate by interconnecting flip-flops in the IC, to form a chain (called scan chain) in such a manner as to make them operate as a single large shift register.

As shown in FIG. 1, scan flip-flops have a secondary input, referred to as scan input (SI), which may be used for testing purposes. The output of scan flip-flop 102A can be interconnected to the scan input of scan flip-flop 102B so that they operate as part of a single large shift register, in scan (or test) mode. Scan flip-flops may be implemented as scan cells in integrated circuits.

Figure 2:
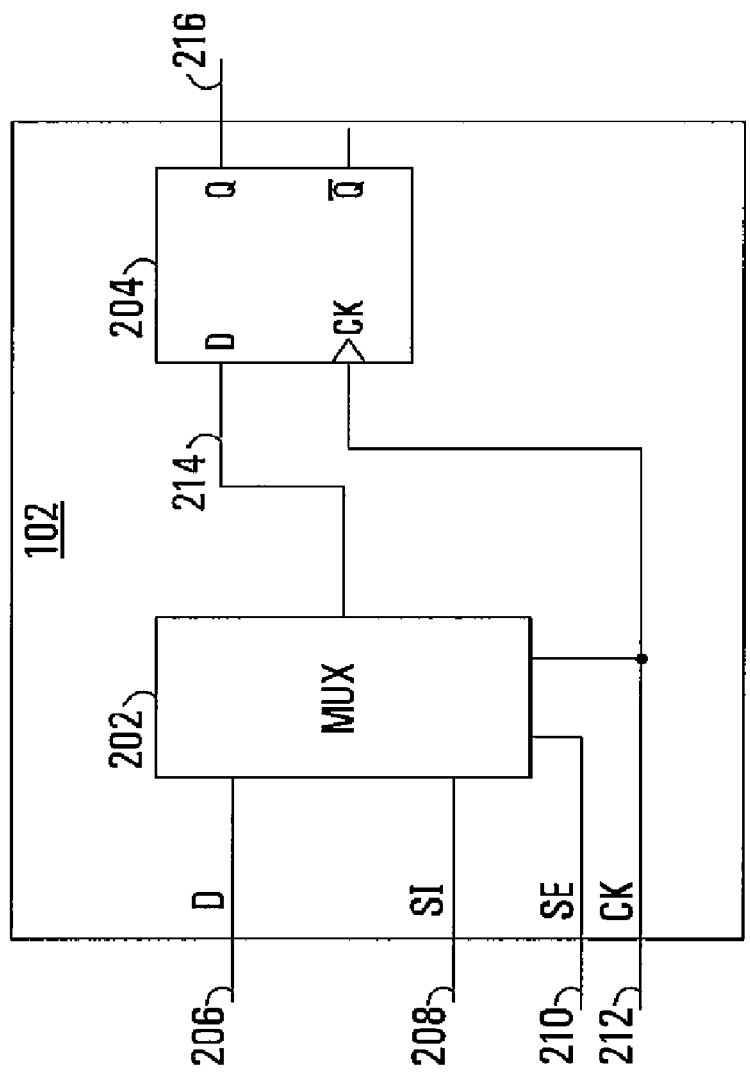
FIG. 2 is a schematic block diagram of a conventional scan flip-flop used in FIG. 1.

FIG. 2 is a further simplified schematic block diagram of scan flip-flop 102. As illustrated, scan flip-flop 102 includes a multiplexer 202 interconnected with a conventional single input flip-flop 204. The output node 214 of multiplexer 202 is interconnected to the input of flip-flop 204 which may, for example, be a D-type flip-flop. Scan flip-flop 102 has more inputs than ordinary flip-flop (such as flip-flop 204) due to additional inputs for supplying scan test input data and associated control signals. A functional data input 206 is used to provide functional input for normal operation. Scan test data patterns are supplied using the scan input SI 208. A scan-enable (SE) control input 210 is used to control multiplexer 202 to select either normal mode of operation or scan test mode. The output node 216 of the scan flip-flop 102 is simply the output of flip-flop 204. A clock input 212 supplies the clock signal required by flip-flop 204.

In a normal mode of operation, the scan chain does not affect system operation. The scan-enable (SE) signal supplied at input 210 is de-asserted to select the normal functional data inputs into each interconnected scan flip-flop in the scan.

However, in scan mode (test mode), control input 210 of multiplexer 202 receives an asserted scan-enable signal which selects scan input 208 (instead of the functional data input 206) to be presented at the output of multiplexer 202 (and thus at the input of flip-flop 204). While in scan mode, scan test patterns are shifted into flip-flop 204. After these test patterns are scanned into flip-flops 204, the circuit may be placed in normal mode for one or more cycles.

The circuit is then placed in scan mode again, and the contents of the scan registers (test results) are serially shifted out (or scanned out) for comparison with expected output values. Thus, using scan tests, just a few additional pins—typically a scan-input (SI) pin, scan-output (SO) pin, and a scan-enable (SE) pin—are needed to test the integrated circuit effectively, without having to run test-vector based tests.

Figure 3:
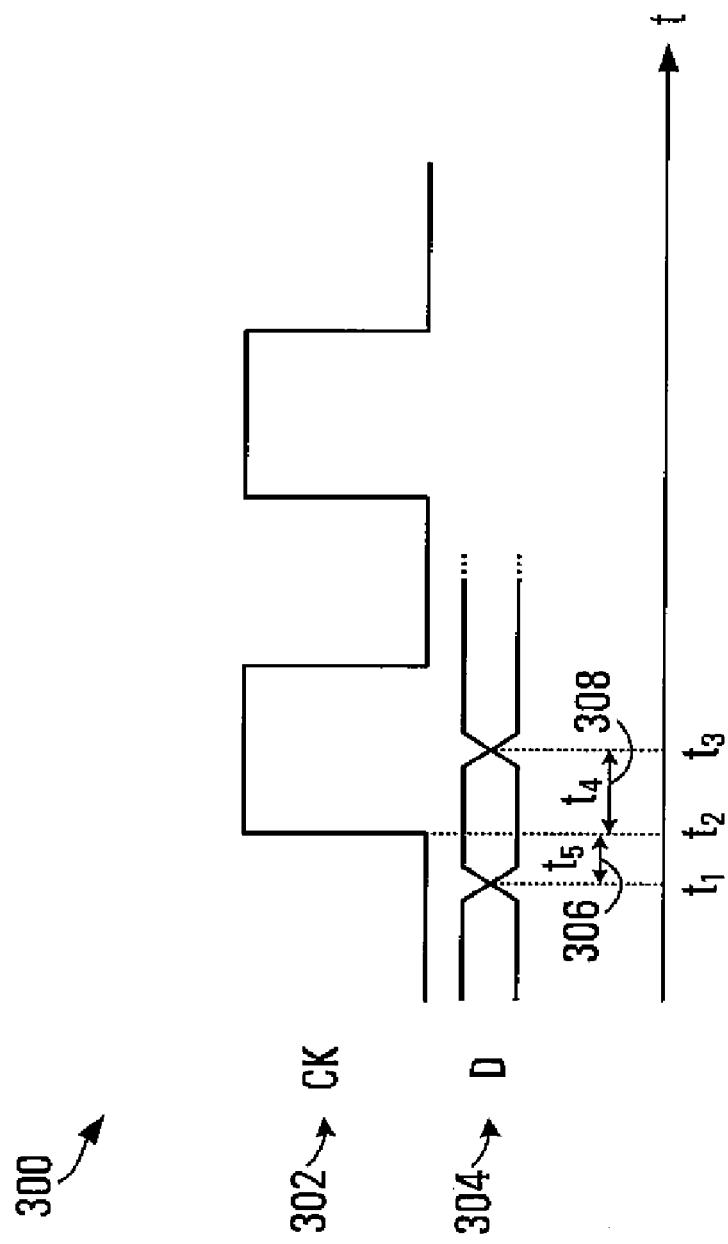
FIG. 3 is a timing diagram depicting a clock signal, and a data signal illustrating setup and hold times.

Although scan chains enable post-production testing of adequate coverage as noted above, hold-time violations may occur in the scan chain. FIG. 3 is a timing diagram 300 illustrating a clock signal 302 along with a data signal 304 and the respective setup-time 306 and hold-time 308. Setup-time 306 and hold-time 308 are defined relative to the rising edge of clock signal 302 using time instants $t_1$, $t_2$ and $t_3$. As depicted, setup-time ($t_S$) is the time required for the data signal to remain at a given level (high or low) before the rising edge of the clock signal. The rising edge of clock signal 302 is shown at time instant $t_2$. The setup-time extends from $t_1$ to $t_2$. Similarly hold-time ($t_H$) is the minimum duration of time, after the rising edge of the clock, during which the data signal level should remain unchanged. The hold-time ($t_H$) extends from $t_2$ to $t_3$.

If a signal changes before the required minimum duration after the rising edge of the clock (or more generally the clock edge at which outputs are activated) during which it should remain unchanged, then a hold-time violation occurs. In FIG. 3, if the data signal 304 changes between $t_2$ and $t_3$, then a hold-time violation occurs.

Hold-time violations at the data input of scan flip-flop 102A (in FIG. 1), may be observed for example, if the clock skew between clock signals supplied to scan flip-flops 102A and 102B, causes the signal at the output of scan flip-flop 102A to arrive too early at the input of scan flip-flop 102B. With reference to FIG. 3, if signal 304 is at the input of scan flip-flop 102B (FIG. 1), then change of signal 304 at time instant $t_x$ where $t_2<t_x<t_3$, will cause a hold-time violation.

Hold-time violations are often observed in scan chains due to the lack of logic between the output of one flip-flop and the input of another flip-flop. In FIG. 1, while circuit 100 is operated in normal mode, the propagation of a signal from the output of scan flip-flop 102A is delayed by combinatorial block 104 before reaching scan flip-flop 102B. However, in scan mode there is no corresponding delay. Thus the output of scan flip-flop 102A may arrive at the input of scan flip-flop 102B too early, thereby causing a hold-time violation.

The conventional solution to this problem has been to insert buffers 108 along the path of the scan test signal. However, as noted above, inserting buffers is disadvantageous. Each buffer has an associated cost in power consumption. In addition, each buffer consumes area in the integrated circuit die, which in turn increases production cost.

Figure 4:
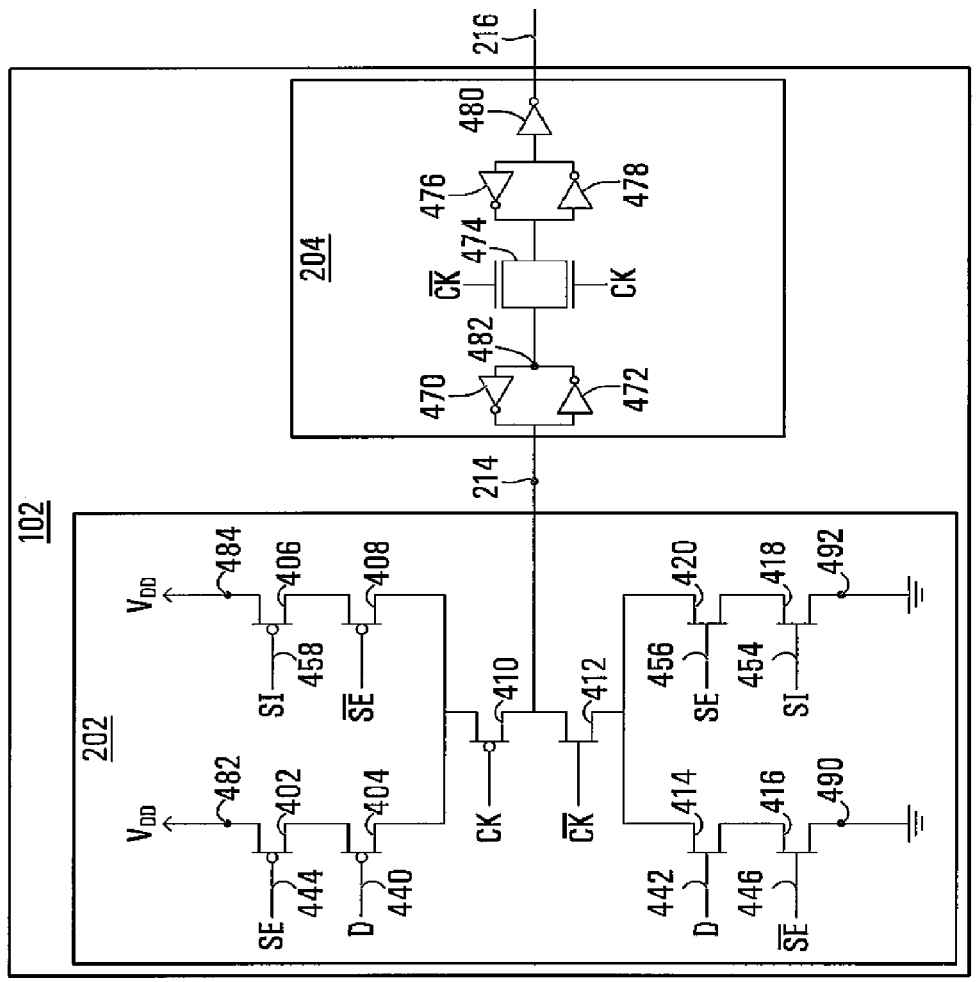
FIG. 4 is a transistor-level schematic diagram of the scan flip-flop of FIG. 2.

FIG. 4 depicts a transistor-level diagram of a conventional scan flip-flop 102 which was depicted in FIG. 2 at the gate-level. As illustrated, multiplexer 202 includes transistors 402, 404, 406, 408, 410, 412, 414, 416, 418, 420, 422. Flip-flop 204 includes inverters 470, 478, 480, tri-state inverters 472, 476 and transmission gate 474. Each transistor is metal-oxide-semiconductor-field effect transistor (MOSFET). Transistors 402, 404, 406, 408, 410 are p-channel metal oxide semiconductor (PMOS) transistors while transistors 412, 414, 416, 418, 420 are n-channel metal oxide semiconductor (NMOS) transistors. The gate terminals of transistors 410 and 412 are used to receive a clock signal (CK) and its inverse ($\overline{CK}$) signal respectively.

The transistors are sized to obtain balanced rise/fall signal transitions at the output of multiplexer 202. The widths of transistors 402, 404, 406, 408, 410, 412, 444, 446, 420, 418 are 330 nm, 330 nm, 200 nm, 200 nm, 300 nm, 240 nm, 260 nm, 260 nm, 150 nm, 150 nm respectively.

Flip-flop 204 includes inverters, 472, 478, 480 and tri-state inverters 470, 476 which may be complimentary metal-oxide-semiconductor inverters (CMOS inverters) and a transmission gate 474. Transmission gate 474 accepts the clock signal CK and its complement ($\overline{CK}$).

As noted, each transistor in multiplexer 202 is field-effect-transistor (FET) which has three terminals: gate, source and drain, acting as a switch. A FET acting as a switch which may be on or off, depending on the value of an input signal presented at its gate. In FIG. 4, a PMOS transistor is generally off when the signal at its gate is high, while an NMOS transistor is generally on the signal at its gate is high. Conversely a PMOS transistor is on when the signal at its gate is low, while an NMOS transistor is off the signal at its gate is low.

PMOS transistors 402, 404 which are connected in series, form a two-input PMOS-AND structure since current can only flow through the transistors if both transistors are on. Similarly, transistors 406, 408 form a PMOS-AND structure. Conversely, NMOS transistors 414, 416 form a two-input NMOS-AND structure. Similarly NMOS transistors 420, 418 form an NMOS-AND structure.

In operation, when CK=0, clock gating transistors 410, 412 are on, but they are off when CK=1. Thus the signal value at node 214 is determined by the input (D or SI) values while CK=0.

Now, when the scan enable input is high (SE=1), both transistor 402 and transistor 416 are off. Since transistor 402 is off, there is no signal path between node 482 and node 214. Similarly since transistor 416 is also off, there is no signal path between node 490 and node 214. However, when the scan-enable signal input is high (SE=1), both transistor 408 and transistor 420 are on. Therefore, the voltage at output node 214 depends on the SI input signal (the data input D has no effect). The multiplexing operation is now apparent. When SE=1, the output voltage of multiplexer 202 is determined by the value SI. Thus setting SE=1, effectively selects the SI input to multiplexer 202 to determine the signal presented at output node 214.

Now, if SI=1, transistor 406 is off (no signal path between nodes 484 and 214), but transistor 418 is on. Therefore there is a signal path between nodes 492 and 214).

If SI=0, the reverse is true—that is, transistor 406 is on (i.e., there is signal path between nodes 484 and 214), but transistor 418 is off (no signal path between nodes 492 and 214).

When CK transitions to high, flip-flop 204 presents the value at node 214 inverted by inverter 480, at its output node 216 until the next rising clock edge.

Figure 5:
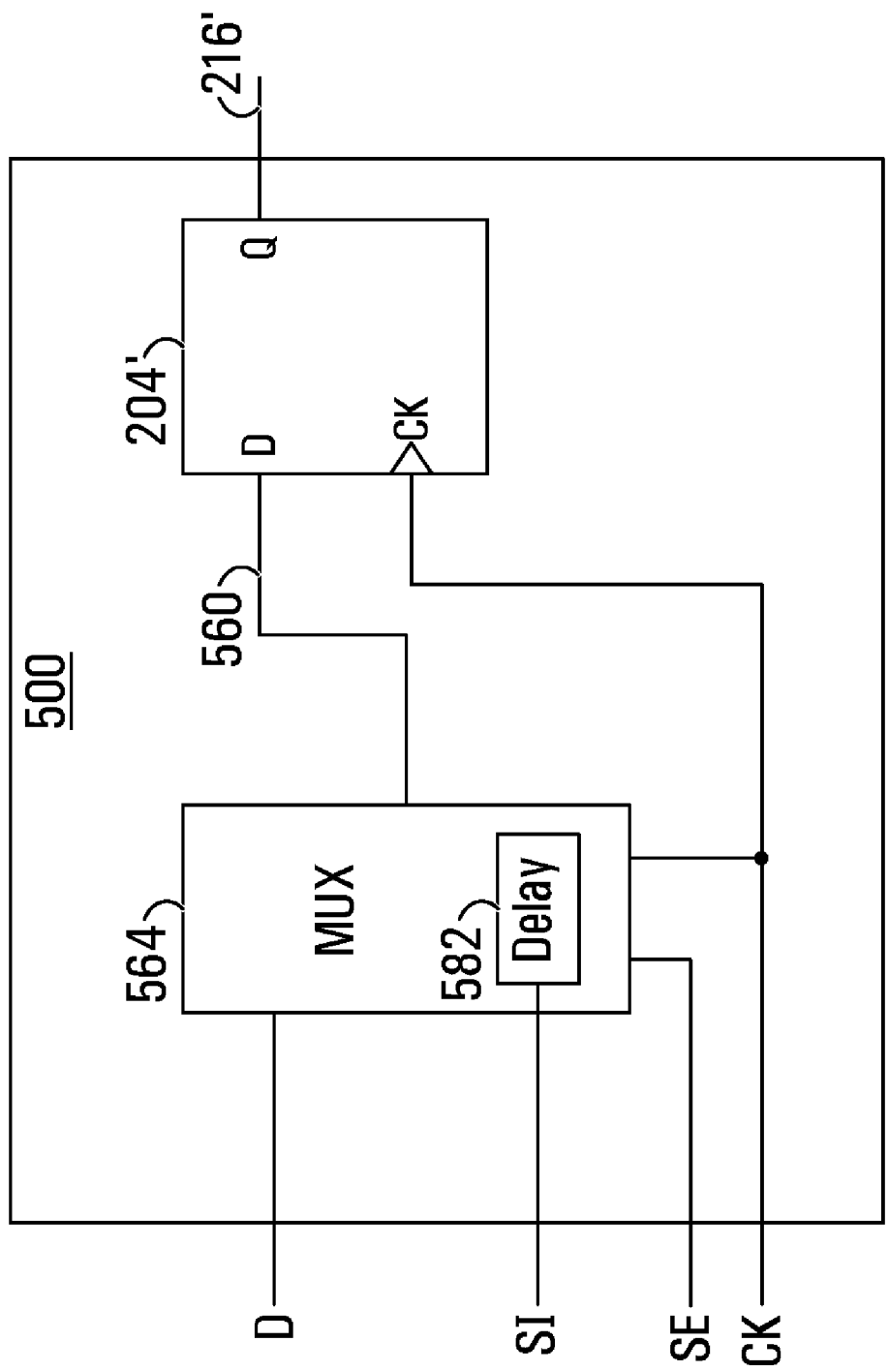
FIG. 5 is a schematic block diagram of a scan flip-flop exemplary of an embodiment of the present invention.

Now, a block diagram of scan flip-flop 500 exemplary of embodiments of the present invention is illustrated in FIG. 5. As illustrated, scan flip-flop 500 includes a multiplexer 564 and single input flip-flop 204'. Multiplexer 564 includes an additional delay element 582, to delay the propagation of the SI signal from one input of a multiplexer 564 to its output node 560 by introducing an internal latency along scan signal path. Conveniently, external buffers required in conventional scan flip-flop interconnections (e.g. buffers 108 in FIG. 1) may be eliminated. Required delays are absorbed into scan flip-flop 500.

Figure 6:
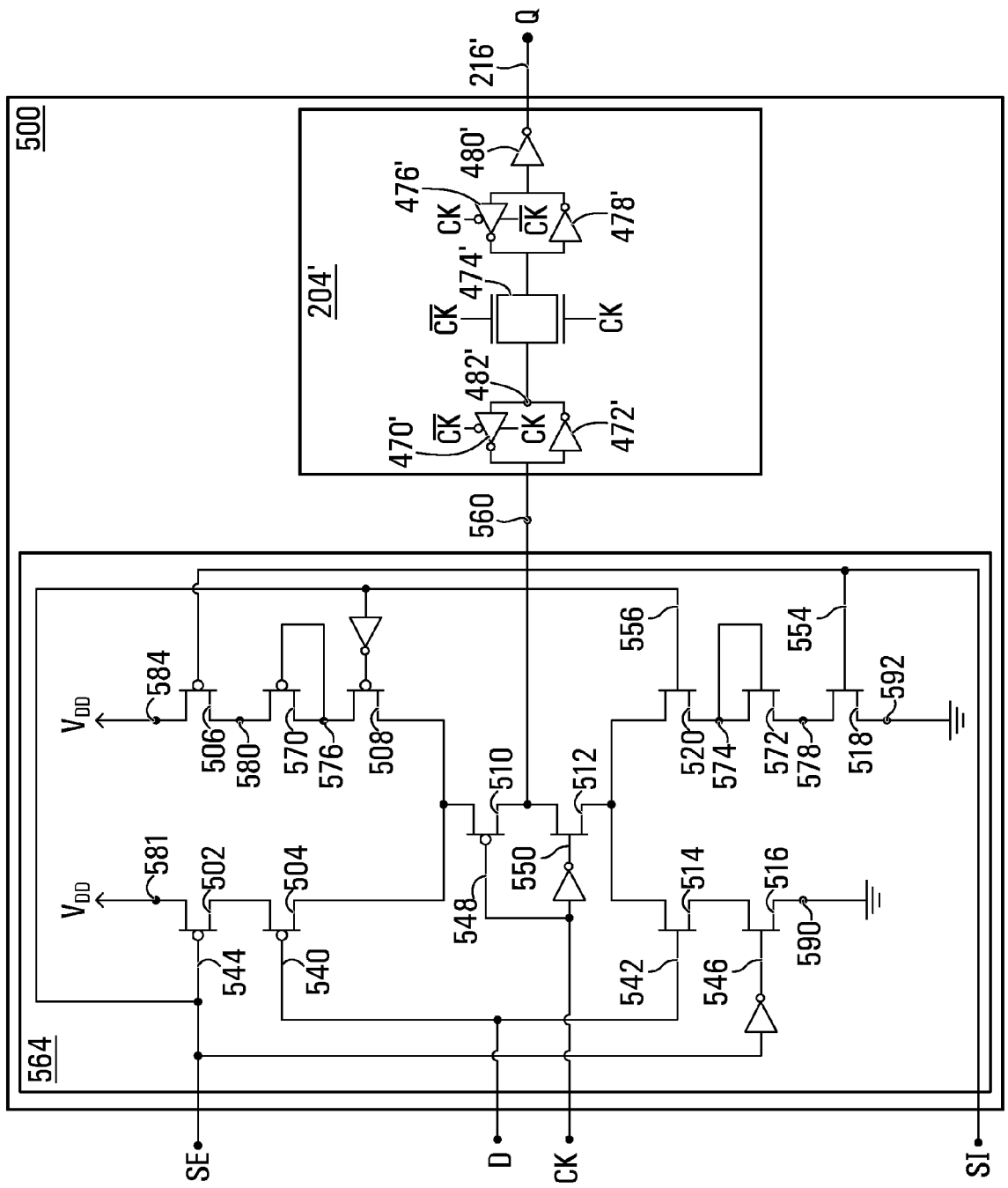
FIG. 6 is a schematic transistor-level circuit diagram of the scan flip-flop of FIG. 5 exemplary of an embodiment of the present invention.

To that end FIG. 6 depicts a transistor-level diagram of scan flip-flop 500 in accordance with one exemplary embodiment of the present invention. Scan flip-flop 500 essentially includes a modified multiplexer 564 and flip-flop 204'. Multiplexer 564 includes transistors 502, 504, 506, 508, 510, 512, 514, 516, 518, 520, 522.

Flip-flop 204' which is substantially the same as flip-flip 204 of FIG. 4 includes inverters 472', 478', 480', tri-state inverters 470', 476' and transmission gate 474'.

Although flip-flop 204' remains unchanged (from FIG. 4), multiplexer 564 includes additional transistors 570 and 572 which have no equivalents in multiplexer 202 (FIG. 4). As will become apparent, transistor 570 and transistor 572 provide the required signal propagation delay to prevent hold-time violations in the SI signal path.

In one exemplary device sizing, the widths of transistors 502, 504, 510, 512, 514, 516, 506, 570, 508, 520, 572, 518 may be 330 nm, 330 nm, 300 nm, 240 nm, 260 nm, 260 nm, 200 nm, 200 nm, 200 nm, 165 nm, 165 nm, 165 nm respectively.

Each transistor in FIG. 6 may be a metal-oxide-semiconductor field-effect-transistor (MOSFET). In the particular embodiment of depicted in FIG. 6, transistors 502, 504, 506, 508, 510 are p-channel metal oxide semiconductor (PMOS) transistors while transistors 512, 514, 516, 518, 520 are n-channel metal oxide semiconductor (NMOS) transistors. Each FET in multiplexer 564 has three terminals called gate, source and drain. A transistor accepts an input signal using its gate terminal. For convenience, the threshold voltage value for each NMOS transistor is denoted $V_{tn}$, while threshold voltage value for each PMOS transistor is denoted $V_{tp}$. The supply voltage value is $V_{DD}$.

As noted, PMOS and NMOS transistors accepting inputs at their gates in FIG. 6 generally operate as switches, which may be on or off depending on the value of an input signal at the gate. When a transistor is on, it conducts current between its drain and source terminals. A PMOS transistor is generally off when the signal at its gate is high, while an NMOS transistor is generally on the signal at its gate is high. Conversely, a PMOS transistor is on when the signal at its gate is low, while an NMOS transistor is off the signal at its gate is low. As noted earlier, PMOS transistors 502, 504 that are connected in series form a PMOS-AND structure. Similarly, transistors 514, 516 form an NMOS-AND structure. In addition, PMOS transistors 506, 570, 508 also form a two-input PMOS-AND structure and NMOS transistors 520, 572, 518 form a two-input NMOS-AND structure with inputs 554, 556.

The gate terminals of clock gating transistors 510 and 512 are used to receive a clock signal (CK) and its inverse ($\overline{CK}$) signal respectively. When CK=0, transistors 510, 512 are on. However transistors 510, 512 are off when CK=1. Thus the signal value at node 560' is determined by the input signal (D or SI) while CK=0.

Now, when the scan enable input is high (SE=1), both transistor 502 and transistor 516 are off. Since transistor 502 is off, there is no signal path between node 581 and node 560. Similarly since transistor 516 is off, there is no signal path between node 590 and node 560. However, when scan enable is high (SE=1) both transistor 508 and transistor 520 are on. Therefore, the voltage at output node 560, depends on the SI input signal.

The output node 560 interconnects either $V_{DD}$ or ground depending on the values of SI, D and SE. This multiplexing operation of multiplexer 564 is apparent when considering FIGS. 7-8. Transistors accepting a scan-enable or a clock signal at their gate are replaced by open circuits if they are off, or by a short circuit if they are on.

Figure 7:
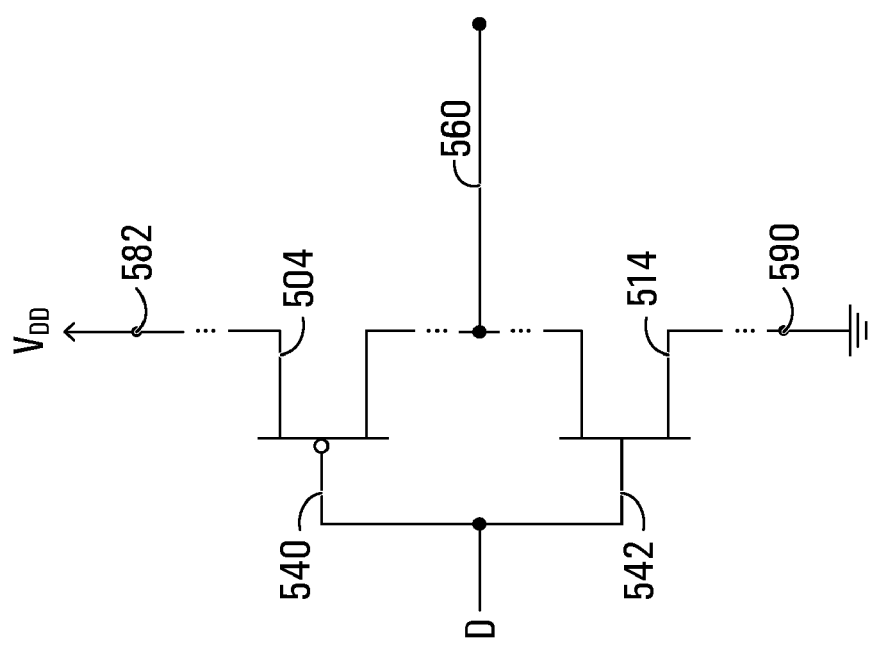
FIG. 7 is an equivalent schematic circuit diagram for the scan flip-flop of FIG. 6 when the clock input is set low and scan-enable input is set low.

FIG. 7 depicts the equivalent circuit when SE=0 (and CK=0). Thus, when SE=0, the output voltage of multiplexer 202 is determined by the data input D (inputs 540, 542). As depicted, the equivalent circuit reduces to a CMOS inverter circuit and the signal at node 560 is simply the inverse or complement of the data input signal D at inputs 540, 542.

Figure 8:
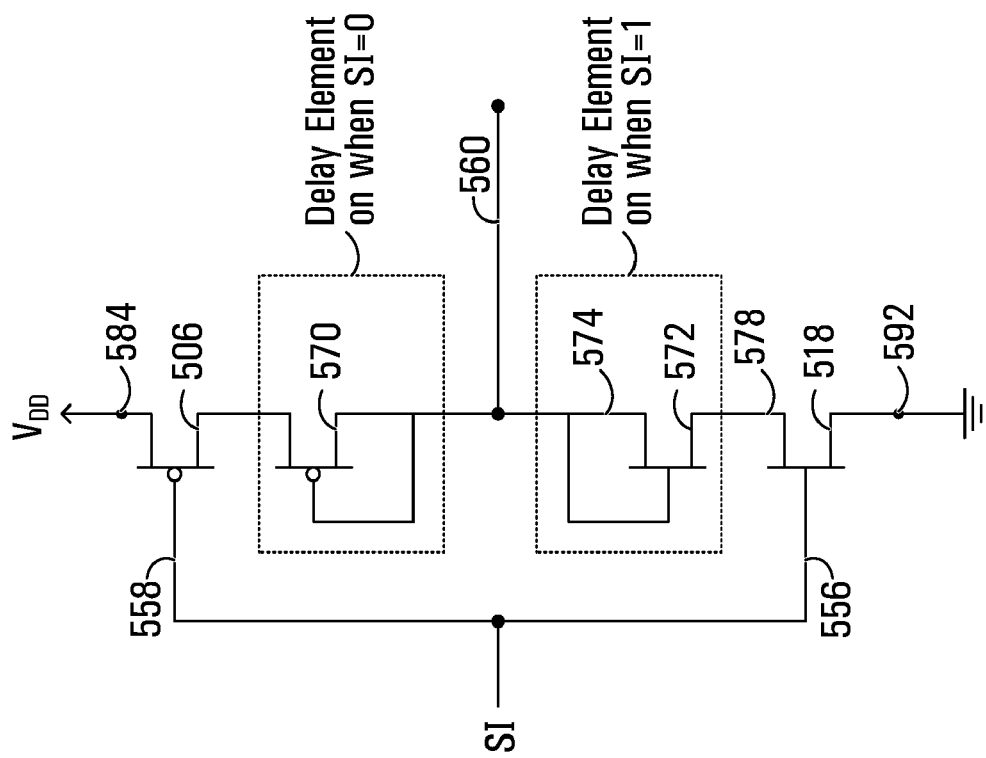
FIG. 8 is an equivalent schematic circuit diagram for the scan flip-flop of FIG. 6 when the clock input is set low and scan-enable input is set high.

FIG. 8 depicts, the resulting equivalent circuit when SE=1 (and CK=0), in scan flip-flop 500. When SE=1, the output voltage of multiplexer 564 is determined by the value SI. In scan mode (SE=1) transistor 506 is off (no signal path between nodes 584 and 560'). However transistor 518 is on and thus there is a signal path between nodes 578 and 592 (electrical ground) which lowers the voltage at node 578. FIG. 8 represents the scan path.

In operation, if SI=1, transistor 518 turns on, lowering the voltage at node 578. Since the gate and drain terminals of transistor 572 are tied together its gate-to-drain voltage $V_{GD}$=0. Transistor 572 turns on slowly and effectively operates as a diode, introducing a voltage drop of $V_{tn}$ between its drain (node 574) and its source (node 578). That is $V_{GS}=V_{DS}=V_{tn}$ for transistor 572. As transistor 572 turns on, it provides a signal path from node 592 (ground) to output node 560. Thus the output at node 560 is low.

If SI=0 however, transistor 506 is on, but transistor 518 is off, which cuts off the signal path between nodes 592 and 560. When transistor 506 turns on, the voltage at node 580 increases. PMOS transistor 570, turns on slowly as its $V_{GS}=V_{tp}$. As both transistors 506, 570 are on, there is now a signal path from node 585 ($V_{DD}$) to node 560. Therefore the output at node 560 is high.

When CK transitions to high, flip-flop 204' presents the value at node 560 inverted by inverter 480', at its output node 216'.

It will appreciated that the output 560 of multiplexer 564 is the inverse (or opposite) signal at its selected input. In alternate embodiments however, the output of multiplexer 564 may be same as the signal at the selected input. Flip-flop 204' thus correspondingly includes an inverter (e.g. inverter 480) to account for the inversion of signals the output of multiplexer 564. Numerous other similar modifications of the presented circuits will be obvious to those of ordinary skill.

A MOSFET such as transistor 570 or transistor 572 with its gate connected to its drain is referred to as a MOS diode. MOS diodes behave as pn-junction diodes in some respects, as current flows through them in only one direction and there is a voltage differential between their respective source and drain terminals when they are turned on. Thus transistor 570 is a PMOS diode while transistor 572 is an NMOS diode. The interconnection in series of transistors 506, 570, 508 is similar to the PMOS-AND structure formed by transistors 406, 408 of FIG. 4 except for the additional PMOS diode transistor 570 that is placed in series between transistor 506 and transistor 508. Similarly the interconnection in series of transistors 520, 572, 518 is similar to the NMOS-AND structure formed by transistors 420, 418 of FIG. 4 except for the additional NMOS diode transistor 572 that is placed in series between transistor 520 and transistor 518. As will be appreciated persons skilled in the art, AND structures may be formed as k-input AND structures by interconnecting k MOS transistors in series, that must all be turned on for the AND structure to conduct. In addition, it would be understood by a skilled reader that components such as a MOS diode (e.g., transistor 570 or transistor 572) or other components may be included in a PMOS-AND structure (or an NMOS-AND structure) without affecting the logical operation of the AND structure.

Additional transistors 570, 572 (the MOS diodes) along the SI path (FIG. 8) change more slowly as their gate and drain terminals are tied together. Moreover, the drain terminals of transistor 570, 572 do not directly interconnect to $V_{DD}$ or ground respectively. Transistors 570, 572 thus do not strongly turn on, which delays the arrival of the signal at node 560, in response to the scan-input signal.

Transistors 572, 570 are thus delay elements which provide a signal propagation delay or internal latency in the scan path. In other words, transistors 572, 570 form delay element 582 in FIG. 5. As multiplexer output node 560 is the input to flip-flop 204', the propagation delay between scan input and node 560 provided by transistors 572, 570, decreases the hold-time at the input of flip-flop 204'. As noted above, transistors are sized to obtain balanced rise/fall signal transitions at the output of multiplexer 564.

The improved hold-time is achieved at the expense of the setup-time, which is correspondingly constrained. This occurs because the late arrival of an input signal cuts into the setup-time (FIG. 3) as the hold-time constraint is relaxed.

Conveniently the delay in the scan signal introduced by transistors 572, 570 would be sufficient to allow sampling of the scan signal at flip-flop 204' on a sampling edge of the clock signal supplied to flip-flop 204', even in the absence of any additional delays in the signal path from the scan input to flip flop 204'.

From the operation of scan flip-flop 500 (FIG. 6 and FIG. 8), it has been noted that transistor 572 introduces a voltage difference of $V_{tn}$ between node 578 and node 574 while transistor 570 introduces a voltage difference of $V_{tp}$ between node 576 and node 580. Thus, during the half of the clock period (when CK=0), the dynamic range of the voltage at node 560 is reduced in contrast to the voltage at node 214 in FIG. 6 that swings rail-to-rail from 0 to $V_{DD}$.

Figure 9:
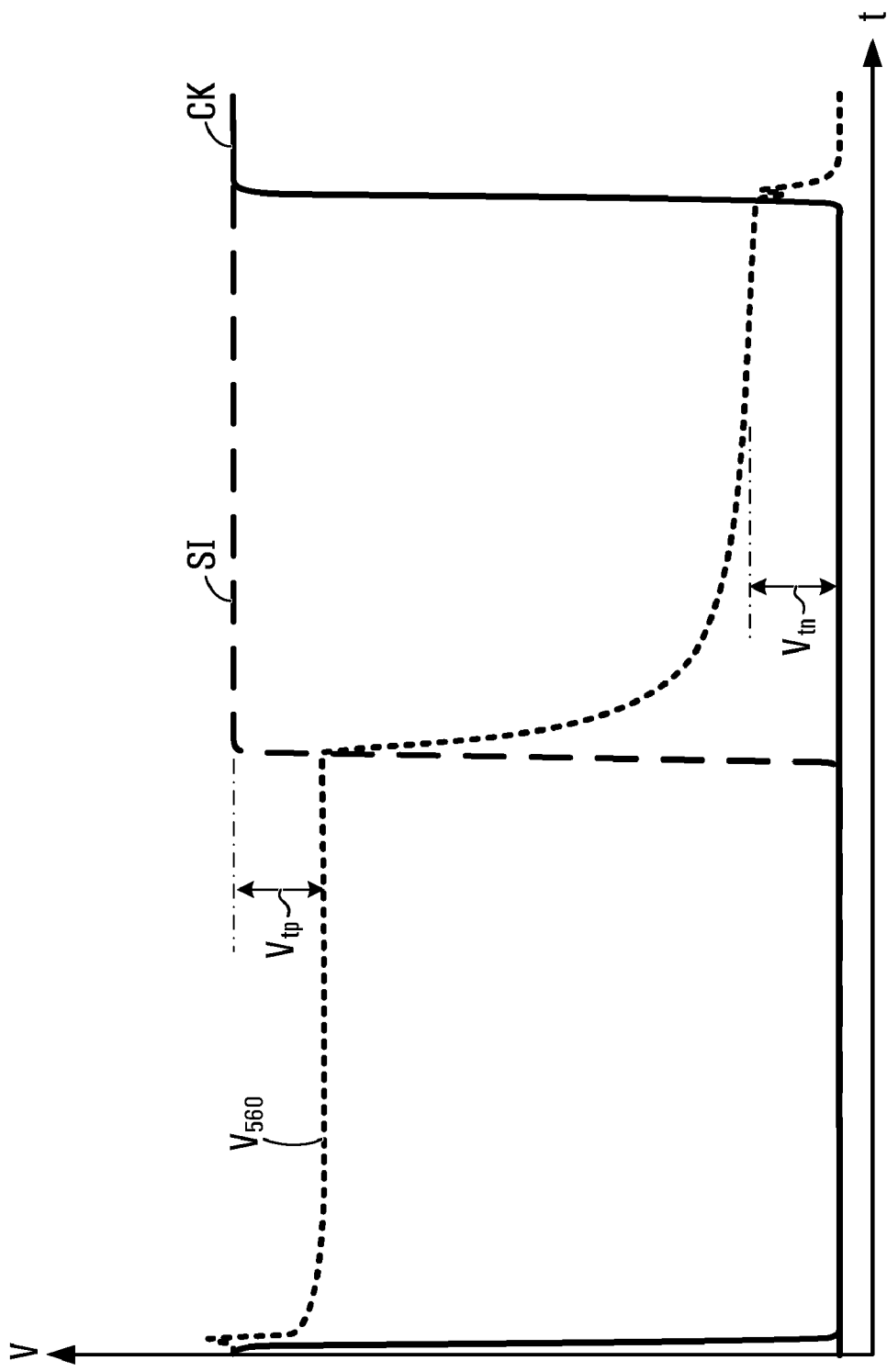
FIG. 9 is a timing diagram depicting a clock signal, and a scan data signal and the input voltage at the feed-forward inverter of FIG. 6.

FIG. 9 depicts the signal levels of CK, SI and the voltage at node 560 (FIG. 6) $V_{560}$. As depicted, $V_{560}$ at node 560 of scan flip-flop 500 changes from $V_{DD}$-$V_{tp}$ to $V_{tn}$ while CK=0. Disadvantageously, the voltage value of $V_{tn}$ (instead of 0 volts) at node 560 increases the leakage current through the feed-forward CMOS inverter 472, leading to increased power consumption. This happens because a voltage input of $V_{tn}$ at inverter 472, turns its PMOS transistor on without completely turning off its NMOS transistor. As the clock signal rises (i.e., CK=1), the feedback transistor 470 generates a voltage signal of $V_{DD}$ at node 560. Thus when CK=1, $V_{560}=V_{DD}$.

Figure 10:
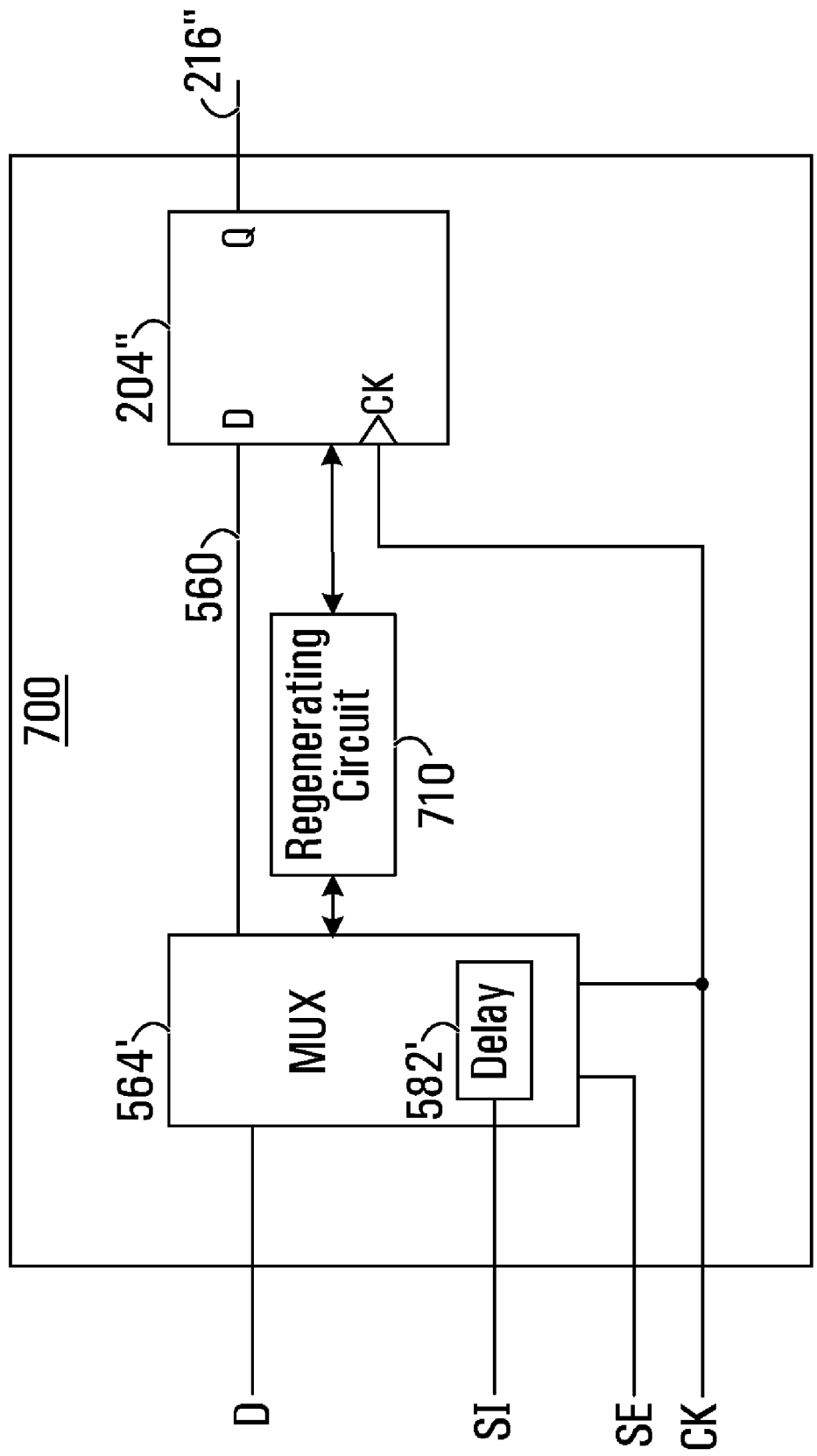
FIG. 10 is a block diagram of a scan flip-flop including a regenerating circuit block, exemplary of another embodiment of the present invention.

Conveniently, the dynamic range of $V_{560}$ at node 560 can be improved by including a regenerating circuit into scan flip-flop 500. Accordingly, FIG. 10 is a block diagram of a scan flip-flop 700 including a regenerating circuit block, exemplary of another embodiment of the present invention. Scan flip-flop 700 includes a multiplexer 564' with delay element 582', a flip-flop 204", a regenerating circuit block 710 and an output node 216". As depicted in FIG. 9, the dynamic range of voltage $V_{560}$ at node 560 is not rail-to-rail (i.e., it does not switch between 0 and $V_{DD}$ volts but $V_{DD}$-$V_{tp}$ to $V_{tn}$ instead). As noted, this is disadvantageous and accordingly regenerating circuit block 710, adjusts the voltage $V_{560}$ at node 560 to either 0 or $V_{DD}$ volts.

Figure 11:
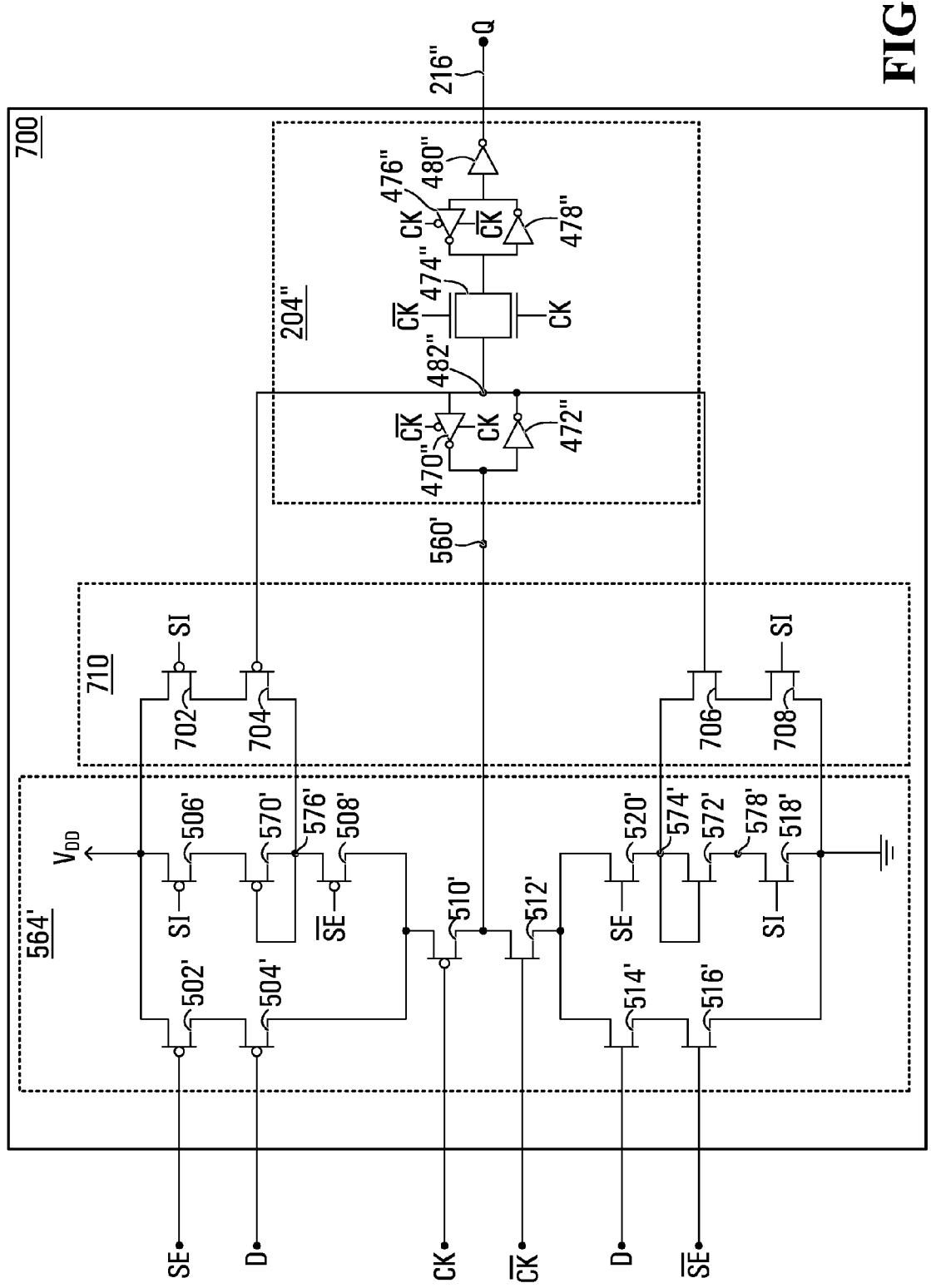
FIG. 11 is a schematic transistor-level circuit diagram of the scan flip-flop of FIG. 10 including a regenerating circuit block, exemplary of another embodiment of the present invention.

FIG. 11 depicts a schematic circuit diagram of a transistor-level design of scan flip-flop 700 including its regenerating circuit block 710. Scan flip-flop 700 includes multiplexer 564' which further includes delay element 582', a regenerating circuit 710 and flip-flop 204". The design of multiplexer 564', and flip-flop 204" are the same as their counterparts of scan flip-flop 500 (i.e., multiplexer 564, and flip-flop 204') in FIG. 5. However, transistor widths may be adjusted to compensate for the added load in the feedback loop and maintain the setup and hold times at data input D. The transistor widths of transistors 502', 504', 510', 512', 514', 516', 506', 570', 508', 520', 572', 518' may be 330 nm, 150 nm, 380 nm, 300 nm, 300 nm, 260 nm, 190 nm, 250 nm, 190 nm, 150 nm, 250 nm, 150 nm respectively.

Regenerating circuit 710 includes PMOS transistors 702, 704 and NMOS transistors 706, 708. Each transistor in regenerating circuit 710 may have a width of 150 nm. The SI signal is fed to the gates of transistor 702 and transistor 708. The drain terminal of PMOS transistor 704 interconnects node 576' in multiplexer 564' while the drain terminal of NMOS transistor 706 interconnects node 574' in multiplexer 564'.

In operation, when SI is low, node 560' is high and node 482" is low-PMOS transistors 702, 704 are both on which sets node 576' to high or $V_{DD}$.

As SI transitions to high, NMOS transistor 518' turns on, setting node 578' low. Transistors 572', 520' and 512' will each turn on lowering the voltage at node 560' to about $V_{tn}$. As the voltage at node 560' is lowered, the output of inverter 472" remains set to high, which turns transistor 706 on. Therefore the voltage at node 574 is reduced to 0 volts and subsequently node 560 also becomes 0 volts (rather than $V_{tn}$).

As SI rises, transistor 702 turns off so that the voltage at node 576' is unaffected by regenerating circuit 710. Similarly as SI is lowered, transistor 708 turns off so that the voltage at node 574' is unaffected by regenerating circuit 710.

It should be noted that transistor 572' still turns on slowly, and it is only after transistor 706 is also turns on (as a result), that voltage ground is reinforced at node 560' by regenerating circuit 710. Thus the hold-time improvement is realized just as in scan flip-flop 500 of FIG. 6 but the offset voltages (FIG. 9) are eliminated.

Reducing power consumption by using regenerating circuit 710 is particularly advantageous in circuits that may be damaged by excessive current or power dissipation during testing. The yield of integrated circuits may be improved by ensuring that power consumed during testing does not damage delicate components.

For example, in order to reduce test time and consequently test cost, scan test may be performed at very high clock rates. As will be appreciated, running tests at very high clock rates consumes more power than normal circuit operation, and therefore may damage the chip package or the power/ground grid.

As described above, scan flip-flops exemplary of embodiments of the present invention reduce hold-time requirements. Accordingly, they may be used in the scan path without affecting timing along the data path when an integrated circuit is operated in normal mode. Timing requirements in the normal mode of operation should be met without difficulty. In scan mode however, the proposed exemplary flip-flops require a shorter hold-time than their conventional counterparts.

Figure 12:
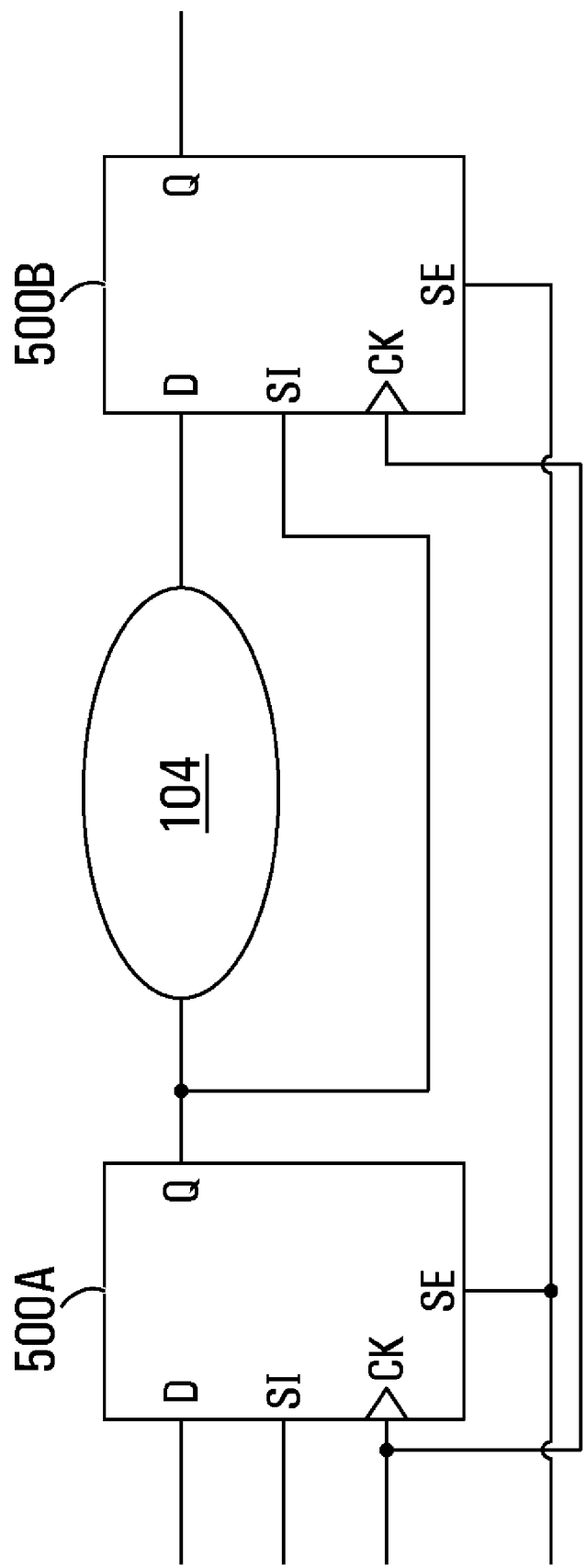
FIG. 12 is a partial schematic diagram of a circuit using scan flip-flops, exemplary of embodiments of the present invention.

Scan flip-flops exemplary of embodiments of the present invention may thus be interconnected to form a scan chain as depicted in FIG. 12 without any delay buffers.

In the first embodiment of FIG. 6, only two additional transistors 570, 572 are needed to relax the hold-time constraint, while conventional buffer insertion requires about 2-3 buffers, each buffer requiring about four transistors. Thus, a substantial advantage is realized by using an embodiment of the present invention in the area and power consumed to fix hold-time violations. As noted, other embodiments may be used to reduce power consumption during testing, by introducing a few more transistors.

FIG. 13 shows the setup ($t_S$), hold-time ($t_H$), power consumption, and the number of transistors needed for scan flip-flops 102 (FIG. 4), 500 (FIG. 6) and 700 (FIG. 11) obtained from simulation of each circuit design using a TSMC 65G technology. As shown, scan flip-flop 500 has a 24.5 ps hold-time improvement over conventional scan flip-flop 102.

The conventional circuit when using three buffers to fix hold-time violations needs 44 transistors in total compared to just 34 for scan flip-flop 500 (FIG. 6). The combined die area consumed by a conventional flip-flop and three buffers can be reduced by as much as 29% by using a single scan flip-flop such as scan flip-flop 500 instead.

In alternate embodiments, clock gating transistors may be eliminated and a tri-state inverter may be added at the output of the multiplexer to decouple the feedback loop from the multiplexer. For example, in one alternate embodiment of scan flip-flop 500, clock gating transistors 510, 512 may be eliminated and a tri-state inverter added at the output of multiplexer 564 to decouple the feedback loop formed by inverters 470' and 472' from multiplexer 564.

As may now be apparent to those with ordinary skill in the art, strict delimitation of the multiplexer block and the flip-flop block within a scan flip-flop design is not required and some elements (such as transistors) may be shared between these two blocks in alternate embodiments.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A scan flip-flop circuit comprising:
   a data input;
   a scan input;
   a data output;
   a flip-flop providing an output signal at said data output of said scan flip-flop circuit;

a multiplexer, for selecting a signal at one of said scan input and said data input, for presentation at an input of said flip-flop;

said multiplexer comprising a delay element, in a signal path between said scan input and said input of said flip-flop, to provide a signal propagation delay between said scan input and said input of said flip-flop, that is in excess of a signal propagation delay between said data input and said input of said flip-flop; and wherein said multiplexer comprises:

(a) a first PMOS-AND structure comprising a plurality of PMOS transistors interconnected in series; and (b) a first NMOS-AND structure comprising a plurality NMOS transistors interconnected in series;

and wherein said first NMOS-AND structure is connected between said first PMOS-AND structure and electrical ground; and said first PMOS-AND structure is interconnected between a supply voltage and said first NMOS-AND structure; and wherein said delay element comprises at least one of (i) a PMOS diode interconnected to two of said PMOS transistors in said first PMOS-AND structure; and (ii) an NMOS diode interconnected to two of said NMOS transistors in said first NMOS-AND structure.

2. The scan flip-flop circuit of claim 1, wherein said multiplexer is formed as a complementary metal oxide semiconductor (CMOS) circuit, comprising p-channel metal oxide semiconductor (PMOS) and n-channel metal oxide semiconductor (NMOS) field effect transistors (FETs).

3. The scan flip-flop circuit of claim 2, further comprising a scan-enable input, wherein said multiplexer selects said signal at one of said scan input and said data input for presentation at said input of said flip-flop, in response to a scan-enable signal at said scan-enable input.

4. The scan flip-flop circuit of claim 1, wherein said multiplexer further comprises:

(i) a second PMOS-AND structure comprising a set of PMOS transistors interconnected in series; and (ii) a second NMOS-AND structure comprising a set of NMOS transistors interconnected in series;

said second NMOS-AND structure placed between said second PMOS-AND structure and electrical ground; said second PMOS-AND structure placed between a supply voltage and said second NMOS-AND structure.

5. The scan flip-flop circuit of claim 4, wherein said first PMOS-AND structure comprises a first input accepting a signal at said scan input and a second input accepting a complement of a signal at said scan-enable input.

6. The scan flip-flop circuit of claim 4, wherein said first NMOS-AND structure comprises a first input accepting a signal at said scan input and a second input accepting a signal at said scan-enable input.

7. The scan flip-flop circuit of claim 5, wherein said first PMOS-AND structure comprises a first PMOS FET interconnected to a second PMOS FET by said PMOS diode; and wherein said first input comprises a gate of said first PMOS FET and said second input comprises a gate of said second PMOS FET.

8. The scan flip-flop circuit of claim 6, wherein said first NMOS-AND structure comprises a first NMOS FET interconnected to a second NMOS FET by said NMOS diode; and wherein said first input comprises a gate of said first NMOS FET and said second input comprises a gate of said second NMOS FET.

9. The scan flip-flop circuit of claim 4, wherein said second PMOS-AND structure has a first input and a second input, and comprises a first PMOS FET interconnected a second PMOS FET; and wherein said first input comprises a gate of said first PMOS FET and said second input comprises a gate of said second PMOS FET.

10. The scan flip-flop circuit of claim 4, wherein said second NMOS-AND structure has a first input and a second input, and comprises a first NMOS FET interconnected a second NMOS FET; and wherein said first input comprises a gate of said first NMOS FET and said second input comprises a gate of said second NMOS FET.

11. The scan flip-flop circuit of claim 1, wherein said delay element provides a delay of about 30 ps to 120 ps.

12. The scan flip-flop circuit of claim 4, further comprising a regenerating block comprising:

a third PMOS-AND structure connected between said power supply and a drain terminal of said PMOS diode; and a third NMOS-AND structure connected between a drain terminal of said NMOS diode and said electrical ground.

13. The scan flip-flop circuit of claim 12, wherein said third PMOS-AND structure comprises a first PMOS FET accepting a signal at said scan input at its gate, connected in series with a second PMOS FET accepting a signal a said input of said flip-flop at its gate.

14. The scan flip-flop circuit of claim 13, wherein said third NMOS-AND structure comprises a first NMOS FET accepting a signal at said input of said flip-flop at its gate, connected in series with a second NMOS FET accepting a signal at said scan input, at its gate.

15. The scan flip-flop circuit of claim 12, wherein said regenerating block forces a signal level presented at said input of said flip-flop to be at said electrical ground when said signal presented at said input of said flip-flop is set high.

16. The scan flip-flop circuit of claim 12, wherein said regenerating block forces a signal level at said input of said flip-flop to be at said supply voltage when said signal presented at said input of said flip-flop is low.

17. A method of operating a scan flip-flop circuit, said scan flip-flop circuit comprising a data signal input for receiving a data signal, a scan input for receiving a scan signal and a clock input for receiving a clock signal, said method comprising:

receiving said scan signal at said scan input;

receiving said clock signal at said clock input;

providing said data signal input and said scan signal input to a multiplexer;

said multiplexer comprising a delay element, in a signal path between said scan input and said input of said flip-flop, to provide a signal propagation delay between said scan input and said input of said flip-flop, that is in excess of a signal propagation delay between said data input and said input of said flip-flop; and wherein said multiplexer comprises:

(a) a first PMOS-AND structure comprising a plurality of PMOS transistors interconnected in series; and (b) a first NMOS-AND structure comprising a plurality NMOS transistors interconnected in series;

and wherein said first NMOS-AND structure is connected between said first PMOS-AND structure and electrical ground; and said first PMOS-AND structure is interconnected between a supply voltage and said first NMOS-AND structure; and wherein said delay element comprises at least one of (i) a PMOS diode interconnected to two of said PMOS transistors in said first PMOS-AND structure; and (ii) an NMOS diode interconnected to two of said NMOS transistors in said first NMOS-AND structure;

providing said clock signal to a flip-flop;

selecting said scan signal using said multiplexer, for presentation at an input of said flip-flop;

introducing a delay in said multiplexer using said delay element; and providing an output of said flip-flop as an output signal of said circuit.

18. The method of claim 17, wherein said delay introduced inside said multiplexer is about 30 ps to 120 ps.

19. The method of claim 17, wherein said multiplexer is formed as a CMOS circuit, comprising PMOS FETs and NMOS FETs.

20. The method of claim 19, further comprising receiving a scan-enable signal wherein said selecting said scan signal is performed in response to said scan-enable signal.

21. The method of claim 20, further comprising forcing a signal level of a signal presented at said input of said flip-flop to be at one of a supply voltage and electrical ground, using a regenerating block.

* * * * *